(12) United States Patent
Kim et al.

(10) Patent No.: US 12,078,931 B2
(45) Date of Patent: Sep. 3, 2024

(54) METAL MASK

(71) Applicant: Samsung Display Co., Ltd., Yongin-si (KR)

(72) Inventors: Seil Kim, Hwaseong-si (KR); Jongbum Kim, Yongin-si (KR); Junghyun Ahn, Seongnam-si (KR); Sang Min Yi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 137 days.

(21) Appl. No.: 17/113,948

(22) Filed: Dec. 7, 2020

(65) Prior Publication Data

US 2021/0286268 A1 Sep. 16, 2021

(30) Foreign Application Priority Data

Mar. 10, 2020 (KR) .................. 10-2020-0029699

(51) Int. Cl.
*H01L 21/308* (2006.01)
*C23C 14/04* (2006.01)
*G03F 7/20* (2006.01)

(52) U.S. Cl.
CPC .......... *G03F 7/2002* (2013.01); *C23C 14/042* (2013.01); *G09G 2330/04* (2013.01); *Y10T 428/12361* (2015.01); *Y10T 428/12389* (2015.01)

(58) Field of Classification Search
None
See application file for complete search history.

(56) References Cited

U.S. PATENT DOCUMENTS

| | | | |
|---|---|---|---|
| 8,746,169 B2 * | 6/2014 | Lee ........................ | C23F 1/02 |
| | | | 118/504 |
| 9,346,078 B2 | 5/2016 | Oh et al. | |
| 10,014,471 B2 | 7/2018 | Baek | |
| 10,374,157 B2 | 8/2019 | Kim et al. | |
| 2008/0019166 A1 | 1/2008 | Jung et al. | |
| 2016/0005970 A1 * | 1/2016 | Kwen ................. | C23C 16/042 |
| | | | 118/504 |

FOREIGN PATENT DOCUMENTS

| | | |
|---|---|---|
| CN | 109207920 A | 1/2019 |
| KR | 10-0714004 B1 | 4/2007 |

(Continued)

*Primary Examiner* — Kim S. Horger
(74) *Attorney, Agent, or Firm* — Lewis Roca Rothgerber Christie LLP

(57) ABSTRACT

A metal mask according to some embodiments of the present disclosure may include a metal thin film having a first thickness and having a first region including a transmission region defining first openings penetrating the metal thin film, and a non-transmission region including an etching portion having a second thickness that is smaller than the first thickness, and a second region adjacent the first region, and defining second openings penetrating the metal thin film, wherein an opening density of the first region is less than an opening density of the second region, the opening density of the first region being defined as a number of the first openings per an area of the first region, and the opening density of the second region being defined as a number of the second openings per an area of the second region.

15 Claims, 11 Drawing Sheets

(56) References Cited

FOREIGN PATENT DOCUMENTS

| KR | 10-2007-0120266 A | 12/2007 |
|----|-------------------|---------|
| KR | 10-2017-0075113 A | 7/2017  |
| KR | 10-2018-0059606 A | 6/2018  |
| KR | 10-2019-0059742 A | 5/2019  |
| KR | 10-2002494 B1     | 7/2019  |

* cited by examiner

METAL MASK

CROSS-REFERENCE TO RELATED APPLICATIONS

This application claims priority to, and the benefit of, Korean Patent Application No. 10-2020-0029699, filed on Mar. 10, 2020, in the Korean Intellectual Property Office, the entire contents of which are hereby incorporated by reference.

BACKGROUND

1. Field

Embodiments of the present disclosure relate to a metal mask with improved reliability.

2. Description of the Related Art

A display panel includes a plurality of pixels. Each of the pixels includes a driving device (e.g., a transistor) and a display device (e.g., an organic light emitting diode). The display device is formed by stacking an electrode and a light-emitting pattern on a substrate.

The light-emitting pattern is formed on a given region of the substrate by a patterning process using a mask with an opening. For example, the light emitting pattern is formed on a region of the substrate exposed through the opening. The shape of the light-emitting pattern is determined by the shape of the opening.

SUMMARY

Some embodiments of the present disclosure provide a highly-reliable metal mask, which is prevented from being deformed or wrinkled, or which exhibits reduced deformation or wrinkling, when the metal mask is stretched.

According to some embodiments of the present disclosure, a metal mask may include a metal thin film having a first thickness and having a first region including a transmission region defining first openings penetrating the metal thin film, and a non-transmission region including an etching portion having a second thickness that is smaller than the first thickness, and a second region adjacent the first region, and defining second openings penetrating the metal thin film, wherein an opening density of the first region is less than an opening density of the second region, the opening density of the first region being defined as a number of the first openings per an area of the first region, and the opening density of the second region being defined as a number of the second openings per an area of the second region.

Each of the transmission region and the non-transmission region may be provided in plural in the first region.

At least two non-transmission regions may be adjacent to each other.

The etching portion of the non-transmission region may be adjacent to the first openings.

The second thickness may be between about 10% to about 50% of the first thickness.

The non-transmission region may further include a second etching portion adjacent to the etching portion, and a rib portion between the etching portion and the second etching portion.

The etching portion and the second etching portion may have substantially a same thickness.

The rib portion and the metal thin film may have substantially a same thickness.

A thickness of the rib portion may be greater than about 30% of a thickness of the metal thin film, and may be smaller than or equal to about 80% of the thickness of the metal thin film.

The area of the first region may be less than the area of the second region.

According to some embodiments of the present disclosure, a metal mask may include a metal thin film having a first region and a second region each defining an opening penetrating the metal thin film, wherein an opening density of the first region is smaller than an opening density of the second region, and wherein the first region includes an etching portion that is adjacent to the opening of the first region, and that has a thickness that is less than a thickness of the metal thin film.

The metal mask may further include a rib portion, wherein the etching portion is provided in plural, and the rib portion is between adjacent etching portions.

The etching portions may have substantially a same thickness as each other.

A thickness of the rib portion may be substantially equal to the thickness of the metal thin film.

A thickness of the rib portion may be greater than about 30% of a thickness of the metal thin film and may be equal to or smaller than about 80% of the thickness of the metal thin film.

An area of the first region may be less than an area of the second region.

The first region may be adjacent to the second region.

According to some embodiments of the present disclosure, a metal mask may include a metal thin film having a first thickness, and including a first region defining first openings, and a second region defining second openings, the first region including a supporting portion having the first thickness, a first etching portion and a second etching portion each having a second thickness that is less than the first thickness, and a rib portion between the first etching portion and the second etching portion, and having a third thickness, wherein an opening density of the first region is less than an opening density of the second region, the opening density of the first region being defined as a number of the first openings per an area of the first region, and the opening density of the second region being defined as a number of the second openings per an area of the second region.

The third thickness may be substantially the same as the first thickness.

The third thickness may be greater than about 30% of the first thickness and is smaller than or equal to about 80% of the first thickness.

BRIEF DESCRIPTION OF THE DRAWINGS

Embodiments of the present disclosure will be more clearly understood from the following brief description taken in conjunction with the accompanying drawings. The accompanying drawings represent non-limiting embodiments as described herein.

Figure 1:
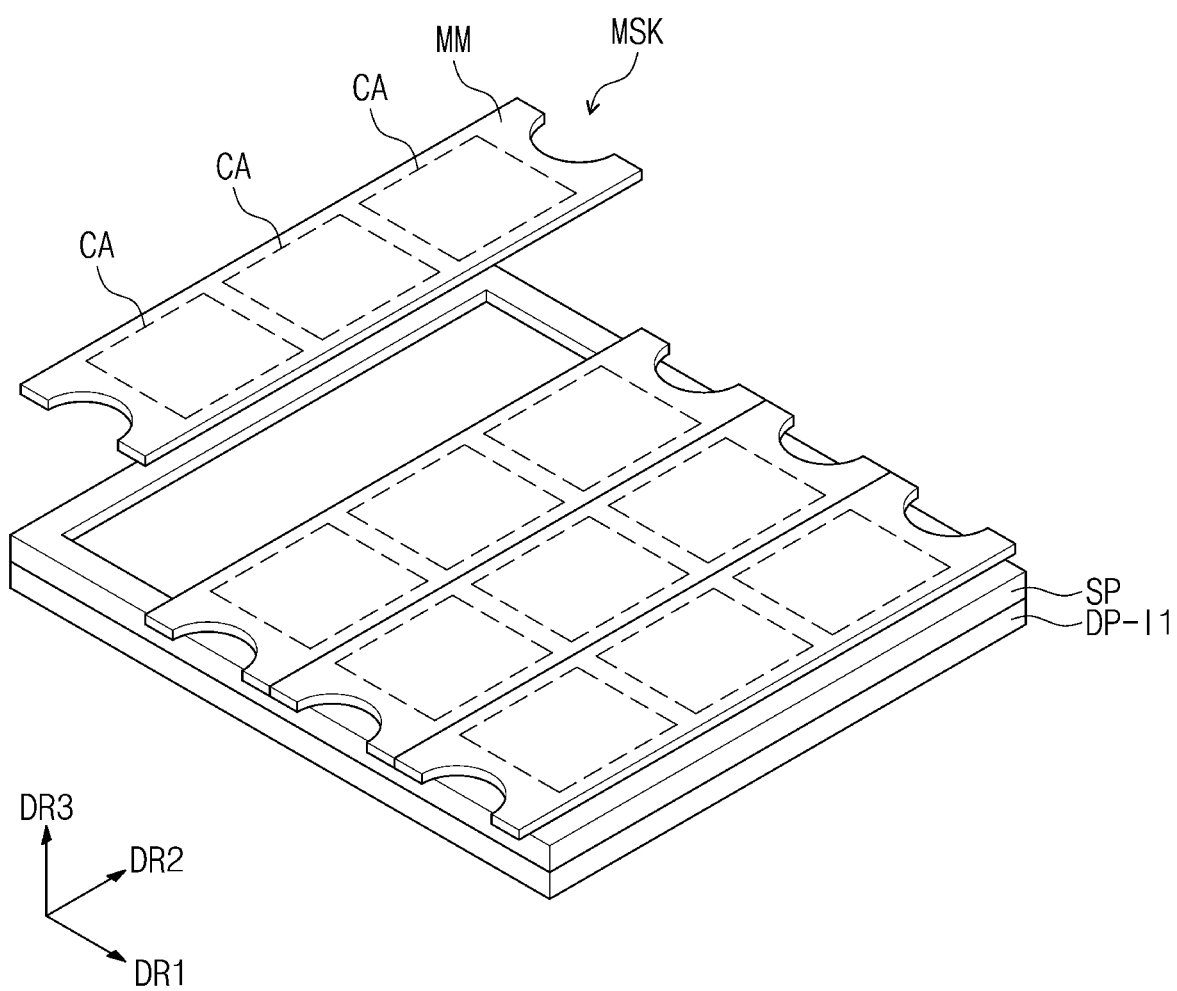
FIG. 1 is a perspective view illustrating a metal mask assembly according to some embodiments of the present disclosure.

It should be noted that these figures are intended to illustrate the general characteristics of methods, structure and/or materials utilized in certain embodiments and to supplement the written description provided below. These drawings are not, however, to scale and may not precisely reflect the precise structural or performance characteristics of any given embodiment, and should not be interpreted as defining or limiting the range of values or properties encompassed by embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments of the present disclosures will now be described more fully with reference to the accompanying drawings, in which embodiments are shown. Embodiments of the present disclosures may, however, be embodied in many different forms and should not be construed as being limited to the embodiments set forth herein; rather, these embodiments are provided so that this disclosure will be thorough and complete, and will fully convey the concept of embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Further, in this specification, the phrase "on a plane," or "plan view," means viewing a target portion from the top, and the phrase "on a cross-section" means viewing a cross-section formed by vertically cutting a target portion from the side.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Embodiments of the present disclosures are described herein with reference to cross-sectional illustrations that are schematic illustrations of idealized embodiments (and intermediate structures) of embodiments. As such, variations from the shapes of the illustrations as a result, for example, of manufacturing techniques and/or tolerances, are to be expected. Thus, embodiments of the present disclosures should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which embodiments of the present disclosures belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view illustrating a metal mask assembly according to some embodiments of the present disclosure.

Referring to FIG. 1, a metal mask assembly may include a metal mask MSK, a supporting plate SP, and an initial substrate DP-I1. According to some embodiments, a plurality of the metal masks MSK may be arranged in a first direction DR1, and may include stick-type metal masks MSK, which can be separated from each other. However, the present disclosure is not limited thereto, and in some embodiments, the metal mask MSK may be provided in the form of a single object.

The supporting plate SP may be located between the metal mask MSK and the initial substrate DP-I1. The supporting plate SP may be provided in the form of a frame exposing at least a portion of the initial substrate DP-I1. The portion of the initial substrate DP-I1 exposed by the supporting plate SP may overlap a plurality of cell regions CA, which are defined in each of the metal masks MSK.

The metal mask MSK may be used to form a plurality of thin patterns, which are included in an organic electroluminescence device, on the initial substrate DP-I1. The supporting plate SP may keep the metal masks MSK and the initial substrate DP-I1 from being in direct contact with each other. Accordingly, it may be possible to reduce or prevent the likelihood of the initial substrate DP-I1 being damaged by contact with the metal masks MSK.

Figure 2:
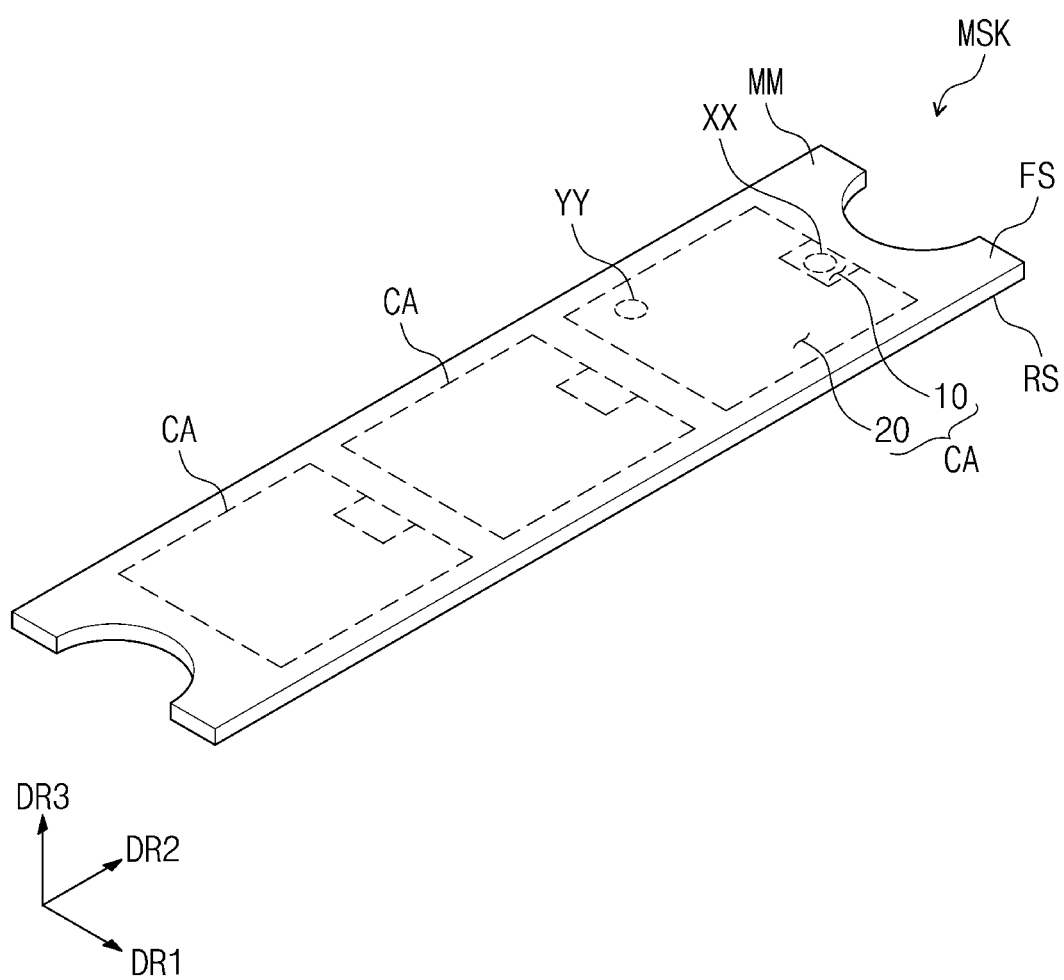
FIG. 2 is a perspective view illustrating a metal mask according to some embodiments of the present disclosure.
Figure 3A:
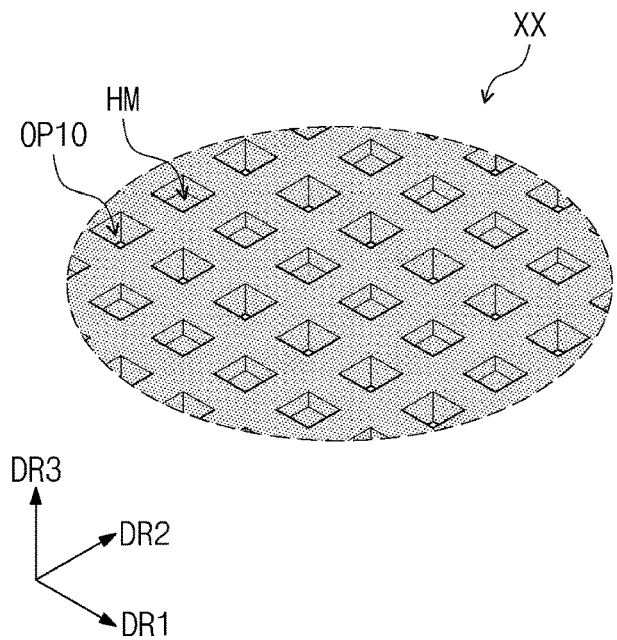
FIG. 3A is an enlarged perspective view illustrating a region XX of FIG. 2.
Figure 3B:
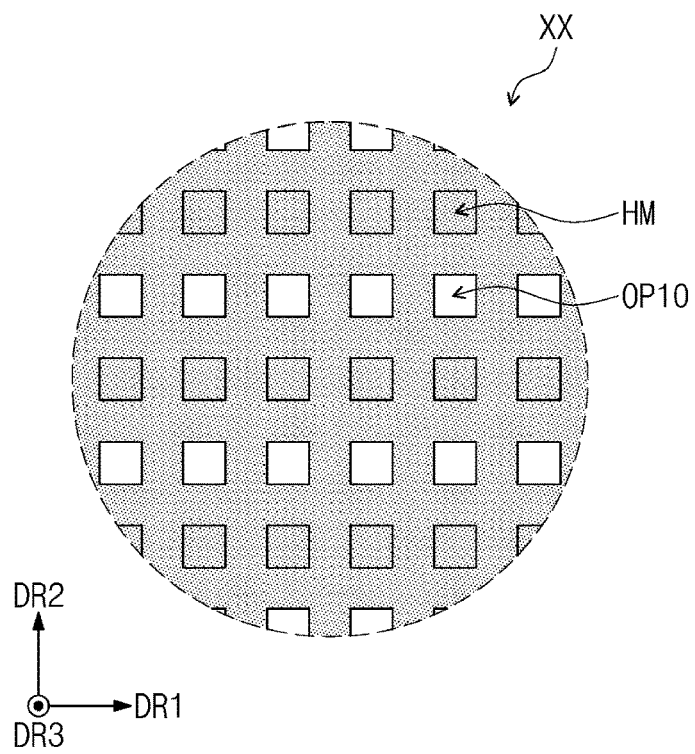
FIG. 3B is an enlarged plan view illustrating the region XX of FIG. 2.
Figure 4A:
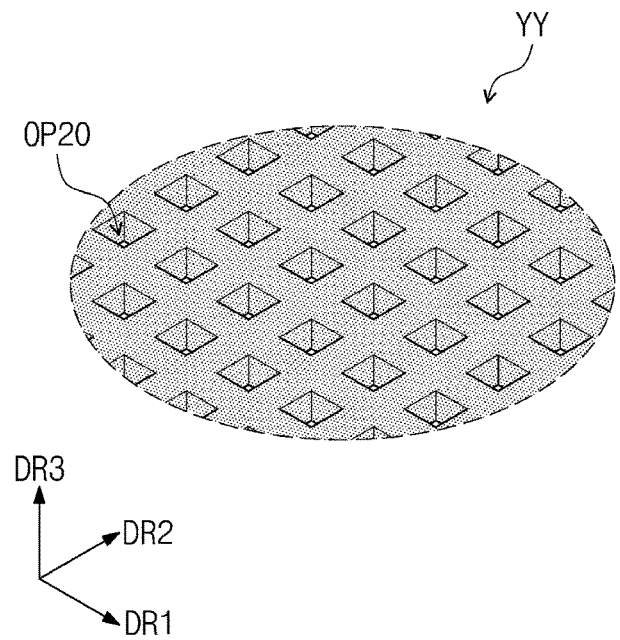
FIG. 4A is an enlarged perspective view illustrating a region YY of FIG. 2.
Figure 4B:
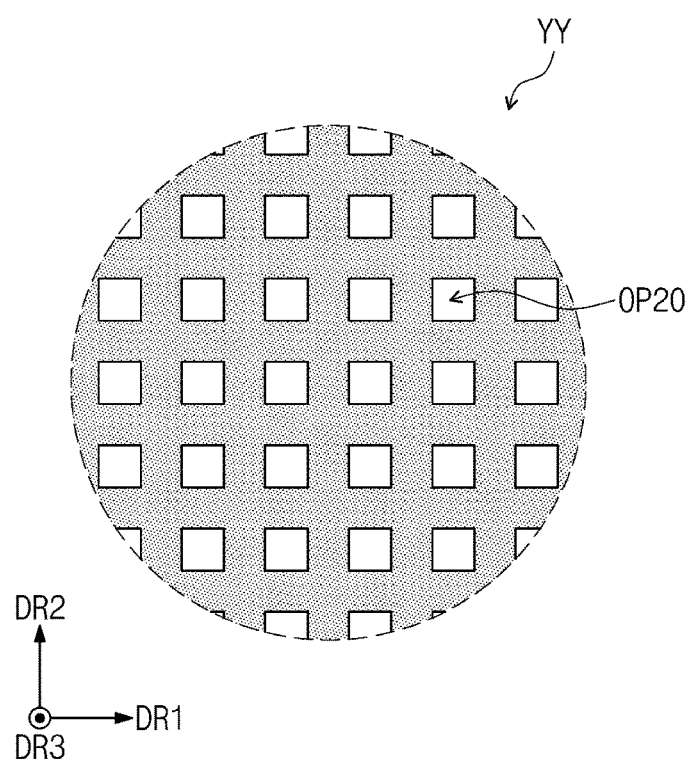
FIG. 4B is an enlarged plan view illustrating the region YY of FIG. 2.

FIG. 2 is a perspective view illustrating the metal mask MSK according to some embodiments of the present disclosure, FIG. 3A is an enlarged perspective view illustrating a region XX of FIG. 2, FIG. 3B is an enlarged plan view illustrating the region XX of FIG. 2, FIG. 4A is an enlarged perspective view illustrating a region YY of FIG. 2, and FIG. 4B is an enlarged plan view illustrating the region YY of FIG. 2.

Referring to FIG. 2, the metal mask MSK may include a metal thin film MM, which has a short side extending in the first direction DR1, and which extends in a second direction DR2. A front surface FS of the metal thin film MM may be parallel to both of the first and second directions DR1 and DR2, and a plurality of the cell regions CA may be defined in the front surface FS. A rear surface RS of the metal thin film MM may be parallel to both of the first and second directions DR1 and DR2, and may be opposite to the front surface FS in a third direction DR3.

In the present specification, directions indicated by the first to third directions DR1, DR2, and DR3 may be relative concept, and in certain embodiments, they may be used to indicate other directions. Hereinafter, first to third directions may be directions indicated by the first to third directions DR1, DR2, and DR3, respectively, and will be referenced with the same numerals.

Each of the cell regions CA may include a first region 10, and a second region 20 adjacent to the first region 10. An area of the first region 10 may be smaller than an area of the second region 20. In some embodiments, the second region 20 may have a shape enclosing at least a portion of, or partially surrounding, the first region 10. FIG. 2 illustrates that the first region 10 has a rectangular shape, but the present disclosure is not limited thereto, and the shape of the first region 10 may be variously changed. In addition, FIG. 2 illustrates that the first region 10 is located at a center of a top portion of the cell region CA, but the present disclosure is not limited thereto. For example, the first region 10 may be located at a side portion of the cell region CA, without the limitation of the center of the top portion of the cell region CA, or may be located in the cell region CA to be fully enclosed by the second region 20.

In some embodiments, the first region 10 may include a region XX, and the second region 20 may include a region YY. The region XX and the region YY may have the same area.

FIGS. 3A and 3B illustrate an enlarged shape of the region XX, which is a portion of the first region 10. Referring to FIGS. 3A and 3B, a plurality of openings OP10 and an etching portion HM may be defined in the first region 10. Hereinafter, an opening OP10 defined in the first region 10 will be referred to as a first opening OP10. The first opening OP10 may penetrate the metal mask MSK. In the drawings, the first opening OP10 is illustrated to have a square shape, but the present disclosure is not limited thereto. In some embodiments, the first opening OP10 may have a diamond shape, a rectangular shape, a circular shape, or the like.

The etching portion HM may be a portion of the metal mask MSK, which is etched in a half etching manner, and which has a given depth from the front surface FS of the metal mask MSK. The etching portion HM will be described in more detail below.

In some embodiments, a plurality of the regions XX may be repeatedly arranged in the first region 10. However, the present disclosure is not limited to the example of FIGS. 3A and 3B, and the present disclosure is not limited to a specific shape of the first opening OP10 and the etching portion HM arranged in the region)X. For example, the first opening OP10 and the etching portion HM may be arranged in various shapes, in the first region 10.

FIGS. 4A and 4B illustrate an enlarged shape of the region YY, which is a portion of the second region 20. Referring to FIGS. 4A and 4B, a plurality of openings OP20 may be defined in the second region 20. Hereinafter, the opening OP20 defined in the second region 20 will be referred to as a second opening OP20. The second opening OP20 may penetrate the metal mask MSK. In the drawings, the second opening OP20 is illustrated to have a square shape, but the present disclosure is not limited thereto. In some embodiments, the second opening OP20 may have a diamond shape, a rectangular shape, a circular shape, or the like.

A plurality of the regions YY may be repeatedly arranged in the second region 20. As shown in FIGS. 4A and 4B, the second openings OP20 may be regularly arranged in the region YY. For example, the second openings OP20 may be spaced apart from each other by a constant distance in the first and second directions DR1 and DR2, and may be arranged in, for example, a matrix shape. However, the present disclosure is not limited thereto, and if necessary, the arrangement of the second opening OP20 may be variously changed.

Referring to FIGS. 3B and 4B, the regions XX and YY, which are portions of the first and second regions 10 and 20, respectively, may have the same area, but the number of the first opening OP10 in the region XX may be smaller than the number of the second opening OP20 defined in the region YY. Accordingly, a density of the first opening OP10 of the first region 10 may be lower than a density of the second opening OP20 of the second region 20.

In FIGS. 3A to 4B, the first opening OP10 and the second opening OP20 are illustrated to have the same shape, but the present disclosure is not limited thereto. For example, the first opening OP10 and the second opening OP20 may have different shapes from each other.

Figure 5:
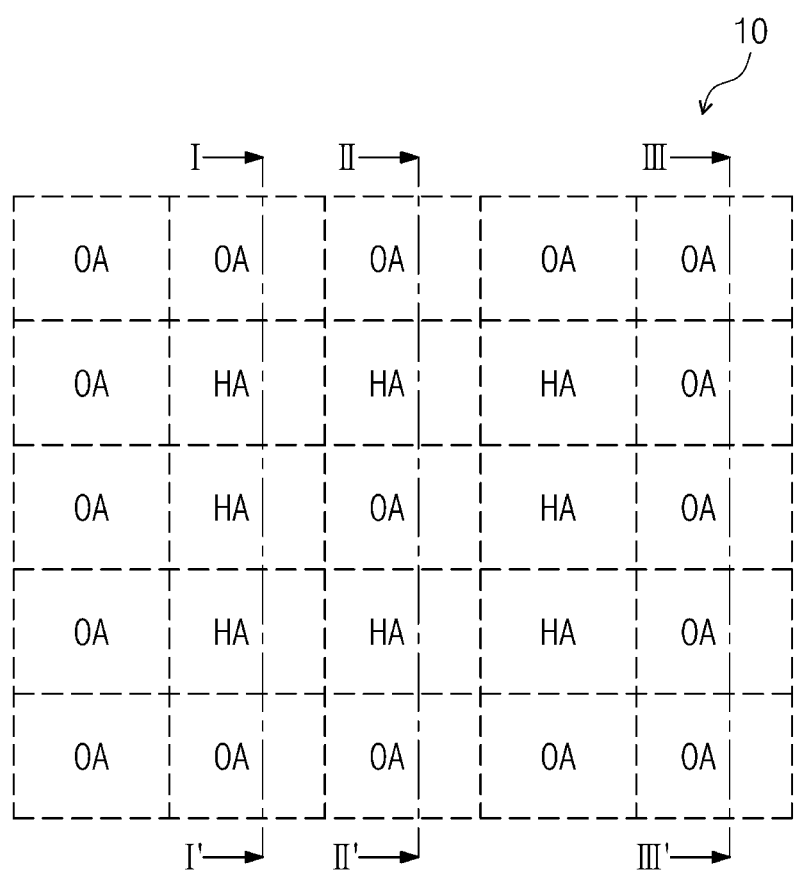
FIG. 5 is a plan view illustrating a first region according to some embodiments of the present disclosure.

FIG. 5 is a plan view illustrating the first region 10 according to some embodiments of the present disclosure.

Referring to FIG. 5, the first region 10 according to some embodiments of the present disclosure may include a transmission region OA and a non-transmission region HA. In some embodiments, a plurality of the transmission regions OA and a plurality of the non-transmission regions HA may be provided. The transmission regions OA and the non-transmission regions HA may be arranged in various manners.

In some embodiments, an order may be the transmission region OA, the non-transmission region HA, the non-transmission region HA, the non-transmission region HA, and the transmission region OA sequentially arranged along the line I-I' of FIG. 5. Also, an order may be the transmission region OA, the non-transmission region HA, the transmission region OA, the non-transmission region HA, and the transmission region OA sequentially arranged along the line II-II' of FIG. 5. Further, the transmission regions OA may be successively arranged along the line III-III' of FIG. 5.

Figure 6A:
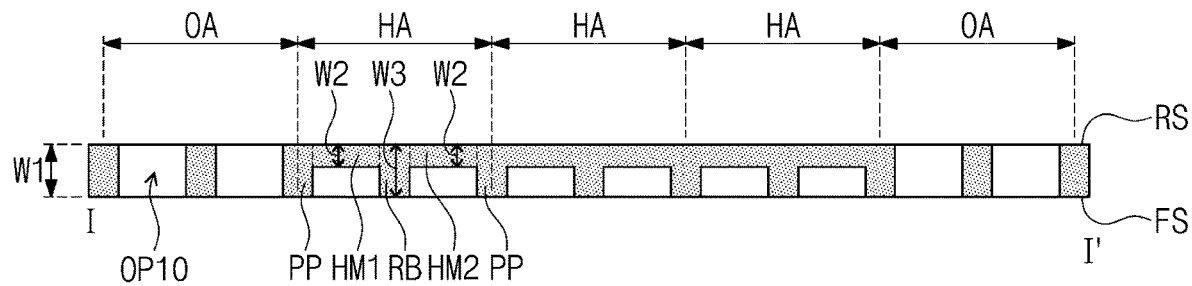
FIG. 6A is a sectional view illustrating an example of a section taken along the line I-I' of FIG. 5.
Figure 6B:
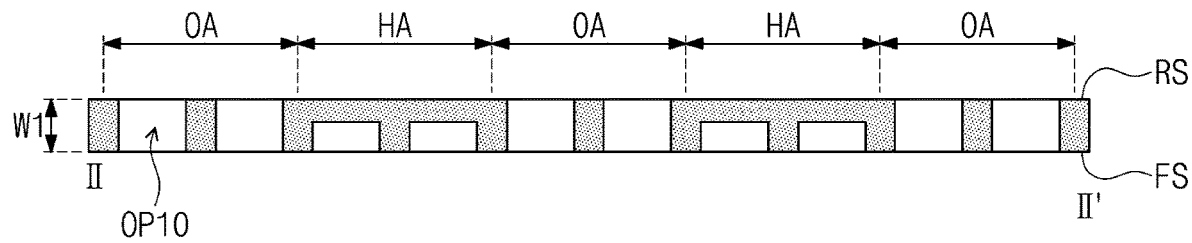
FIG. 6B is a sectional view illustrating an example of a section taken along the line II-II' of FIG. 5.
Figure 6C:
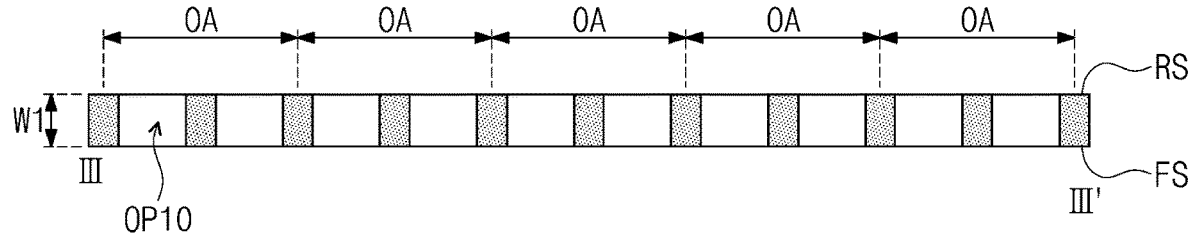
FIG. 6C is a sectional view illustrating an example of a section taken along the line III-III' of FIG. 5.
Figure 6D:
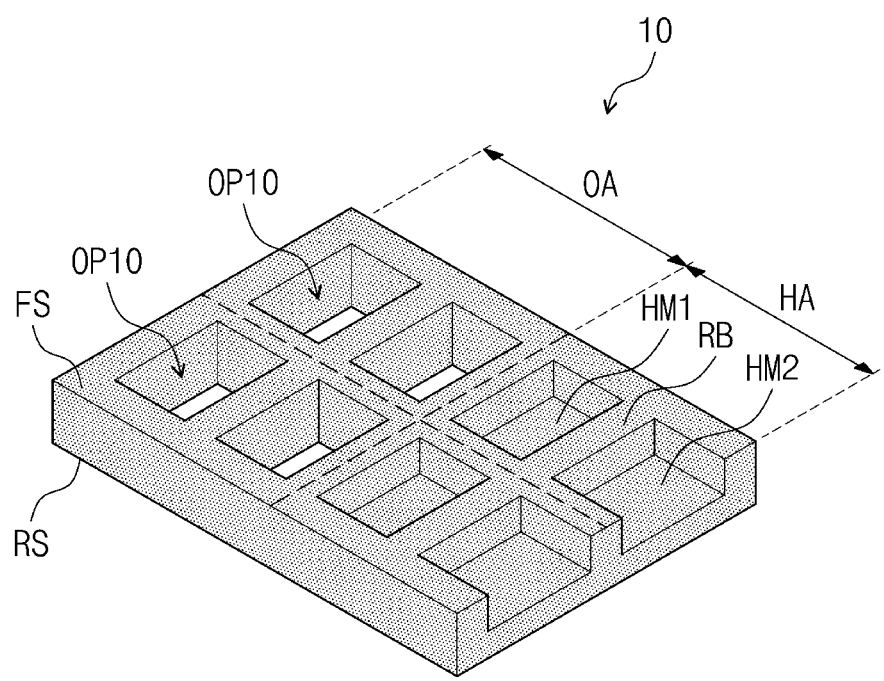
FIG. 6D is an enlarged perspective view illustrating a portion of the first region according to some embodiments of the present disclosure.

FIG. 6A is a sectional view illustrating an example of a section taken along the line I-I' of FIG. 5, FIG. 6B is a sectional view illustrating an example of a section taken along the line II-II' of FIG. 5, FIG. 6C is a sectional view illustrating an example of a section taken along the line III-III' of FIG. 5, and FIG. 6D is an enlarged perspective view illustrating a portion of the first region 10 according to some embodiments of the present disclosure.

Referring to the sectional view of FIG. 6A taken along the line I-I', the first opening OP10 may be defined in the transmission region OA. In some embodiments, a plurality of the first openings OP10 may be provided in the transmission region OA.

A supporting portion PP, a first etching portion HM1, a second etching portion HM2, and a rib portion RB, which is located between the first and second etching portions HM1 and HM2, may be located in the non-transmission region HA. The first and second etching portions HM1 and HM2 may be a portion of the metal mask MSK on which a half etching process is performed, and may have a given depth from the front surface FS.

In the case where the metal thin film MM has a first thickness W1, the first and second etching portions HM1 and HM2 may have a second thickness W2 that is smaller than the first thickness W1. The second thickness W2 may range from about 10% to about 50% of the first thickness W1. For example, the first and second etching portions HM1 and HM2 may be formed by etching the metal mask MSK in a half-etching manner (e.g., by a depth greater than about 50% of the first thickness W1).

The first and second etching portions HM1 and HM2 may be formed by the same half etching process. Accordingly, the first and second etching portions HM1 and HM2 may have substantially same thickness, meaning that a difference in thickness between the first and second etching portions HM1 and HM2 may be within a typical process margin or a typical error tolerance. The half etching process may be a wet etching process.

Although the first and second etching portions HM1 and HM2 are illustrated to have a rectangular shape, the shapes of the first and second etching portions HM1 and HM2 may be variously changed. In addition, the thickness of each of the first and second etching portions HM1 and HM2 may be defined as a thickness that is measured at a center of each of the first and second etching portions HM1 and HM2.

The supporting portion PP and the rib portion RB may be remaining portions that remain after the formation of the first and second etching portions HM1 and HM2 in the non-transmission region HA of the metal mask MSK. The rib portion RB may be located between the first and second etching portions HM1 and HM2. The supporting portion PP and the rib portion RB may have a third thickness W3. The third thickness W3 may be substantially equal to the first thickness W1.

Referring to the sectional view of FIG. 6B taken along the line II-II', at least one non-transmission region HA may be located adjacent to the transmission region OA. In addition, the transmission region OA may be located between the non-transmission regions HA.

Referring to the sectional view of FIG. 6C taken along the line III-III', a plurality of the transmission regions OA may be successively located. Because the plurality of the transmission regions OA are successively located, a plurality of the first openings OP10 may be successively located in a given direction.

FIG. 6D is an enlarged perspective view illustrating a portion of the first region according to some embodiments of the present disclosure. Referring to FIG. 6D, the first opening OP10 may be located in the transmission region OA. The first and second etching portions HM1 and HM2 may be located in the non-transmission region HA. As shown, the first and second etching portions HM1 and HM2 may be located adjacent to the first opening OP10.

As previously described with reference to FIGS. 3B and 4B, a density of the first opening OP10 of the first region 10 may be lower than a density of the second opening OP20 of the second region 20. Due to this difference in the opening density, a volume (e.g., of material) of the first region 10 may be greater than a volume of the second region 20. Because the first region 10 of the metal mask MSK according to some embodiments of the present disclosure includes the first and second etching portions HM1 and HM2, the volume of the first region 10 may be reduced as compared with the case in which the first and second etching portions HM1 and HM2 are not included. Accordingly, because the metal mask MSK according to some embodiments of the present disclosure includes the first and second etching portions HM1 and HM2, it may be possible to reduce a difference in volume between the first and second regions 10 and 20.

A ratio in mean thickness of first region to second region and a ratio in size of wrinkles are summarized in the following table, Table 1.

TABLE 1

| Item | Embodiment 1 | Embodiment 2 | Embodiment 3 | Embodiment 4 | Embodiment 5 |
|---|---|---|---|---|---|
| Ratio in mean thickness of first region to second region | 3.7 | 3.0 | 2.2 | 1.5 | 0.7 |
| Ratio in size of wrinkles | 2.4 | 2.4 | 2.3 | 2.2 | 1.2 |

Referring to Embodiments 1 to 5 of Table 1, if the ratio in mean thickness of the first region 10 to the second region 20 was decreased from 3.7 to 0.7, the ratio in size of the wrinkles was decreased from 2.4 to 1.2.

That is, if the ratio in mean thickness of the first region 10 to the second region 20 was decreased, the ratio in size of the wrinkles formed at a border portion was decreased. Thus, in the metal mask MSK according to some embodiments of the present disclosure, it may be possible to reduce a difference in volume between the first and second regions 10 and 20, and to thereby reduce a size of, or prevent altogether, a wrinkle in the metal mask MSK.

Figure 7A:
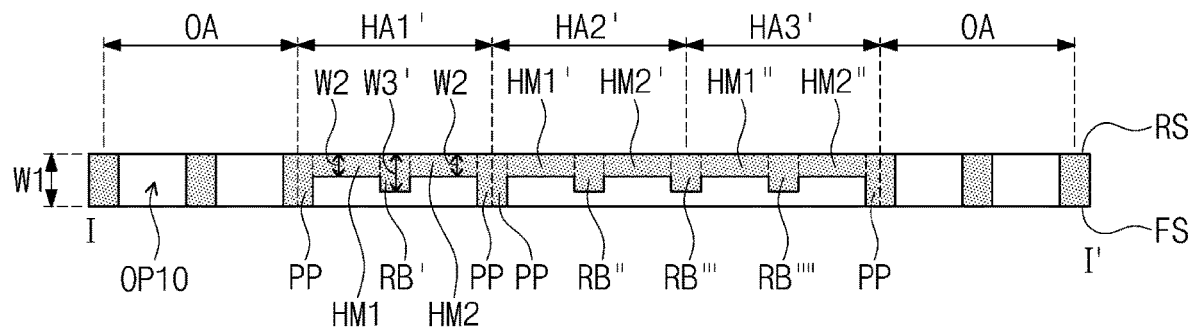
FIG. 7A is a sectional view illustrating another example of the section taken along the line I-I" of FIG. 5.
Figure 7B:
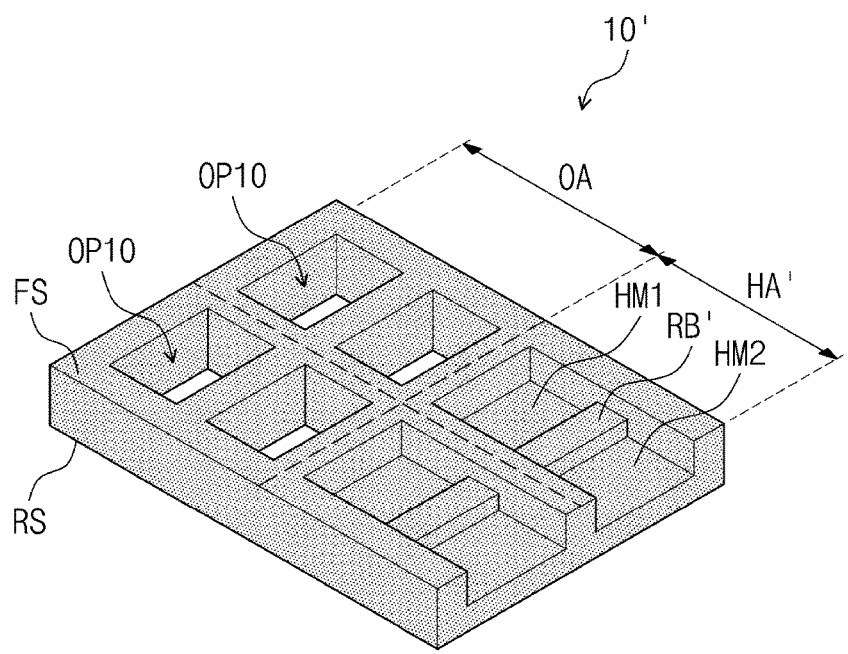
FIG. 7B is an enlarged perspective view illustrating a portion of the first region according to some embodiments of the present disclosure.

FIG. 7A is a sectional view illustrating another example of the section taken along the line I-I' of FIG. 5, and FIG. 7B is an enlarged perspective view illustrating a portion of the first region 10 according to some embodiments of the present disclosure.

As shown in the sectional view of FIG. 7A taken along the line I-I', a first non-transmission region HA1', a second non-transmission region HA2', and a third non-transmission region HA3' may be located between a pair of the transmission regions OA.

In the first non-transmission region HA1' according to some embodiments of the present disclosure, a rib portion RB' located between a first etching portion HM1' and a second etching portion HM2' may have a third thickness W3' that is smaller than the first thickness W1. The third thickness W3' may be greater than about 30% of the first thickness W1, and may be equal to or smaller than about 80% of the first thickness W1. For example, in the formation of the first and second etching portions HM1' and HM2', half-etched regions may be adjusted to overlap each other, and in this case, the rib portion RB' between the first and second etching portions HM1' and HM2' may have a reduced thickness (e.g., a reduced third thickness W3'). The smaller the thickness of the rib portion RB', the smaller the volume of the first region 10 (e.g., the less an amount of material forming the first region 10).

Referring to FIG. 7B, the rib portion RB' located in the non-transmission region HA' may have a given depth from the front surface FS.

Referring back to FIG. 7A, the second non-transmission region HA2' may include the first etching portion HM1', the second etching portion HM2', and a rib portion RB". The third non-transmission region HA3' may include a first etching portion HM1", a second etching portion HM2" and a rib portion RB"".

The rib portion RB" in the second non-transmission region HA2' and the rib portion RB"" in the third non-transmission region HA3' may have thicknesses that are smaller than the first thickness W1, and that are similar to or the same as the thickness W3' of the rib portion RB' of the first non-transmission region HA1'.

In the first region 10, according to some embodiments of the present disclosure, a rib portion RB'" may be located between the second etching portion HM2' of the second non-transmission region HA2' and the first etching portion HM1" of the third non-transmission region HA3'. Because, unlike the supporting portions PP between the second etching portion HM2 of the first non-transmission region HA1' and the first etching portion HM1' of the second non-transmission region HA2', the rib portion RB'" is formed to have the third thickness W3, the volume of the first region 10 may be further reduced.

Figure 8A:
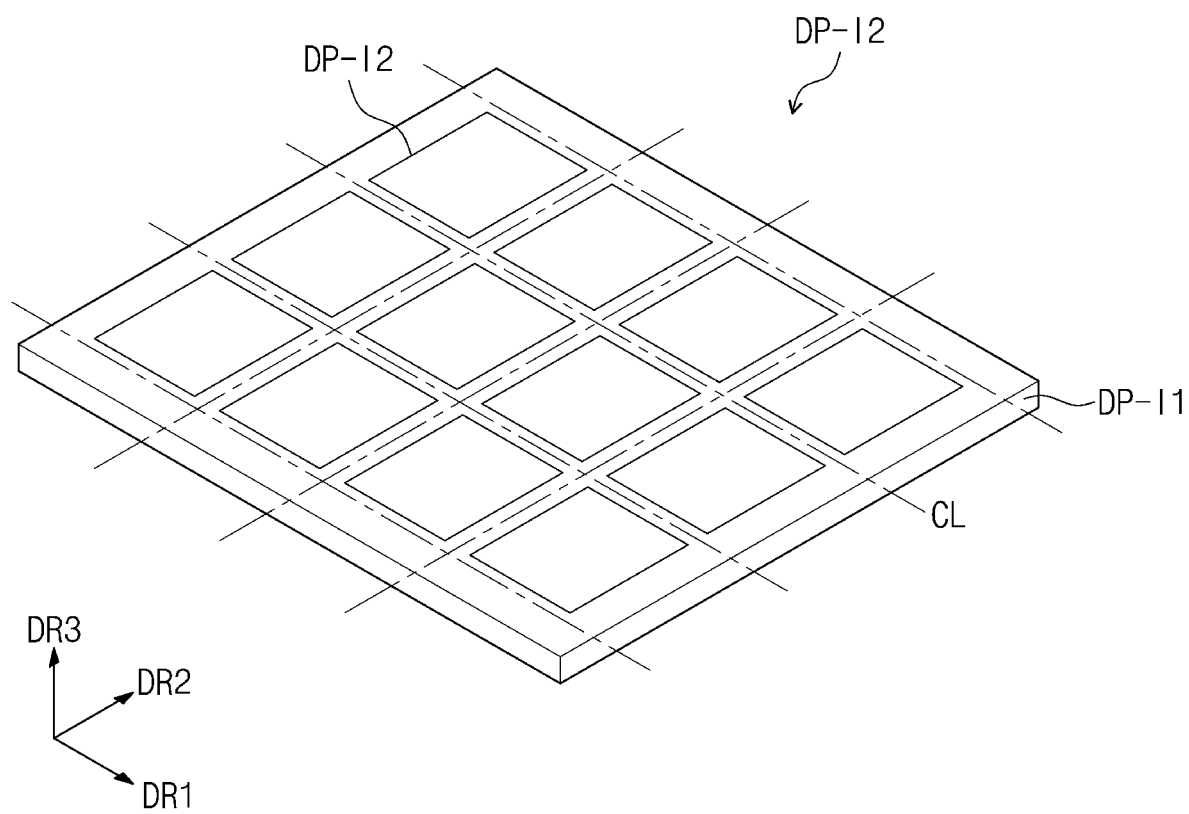
FIGS. 8A to 8C are perspective views illustrating some steps of a method of fabricating a display panel, according to some embodiments of the present disclosure.
Figure 8B:
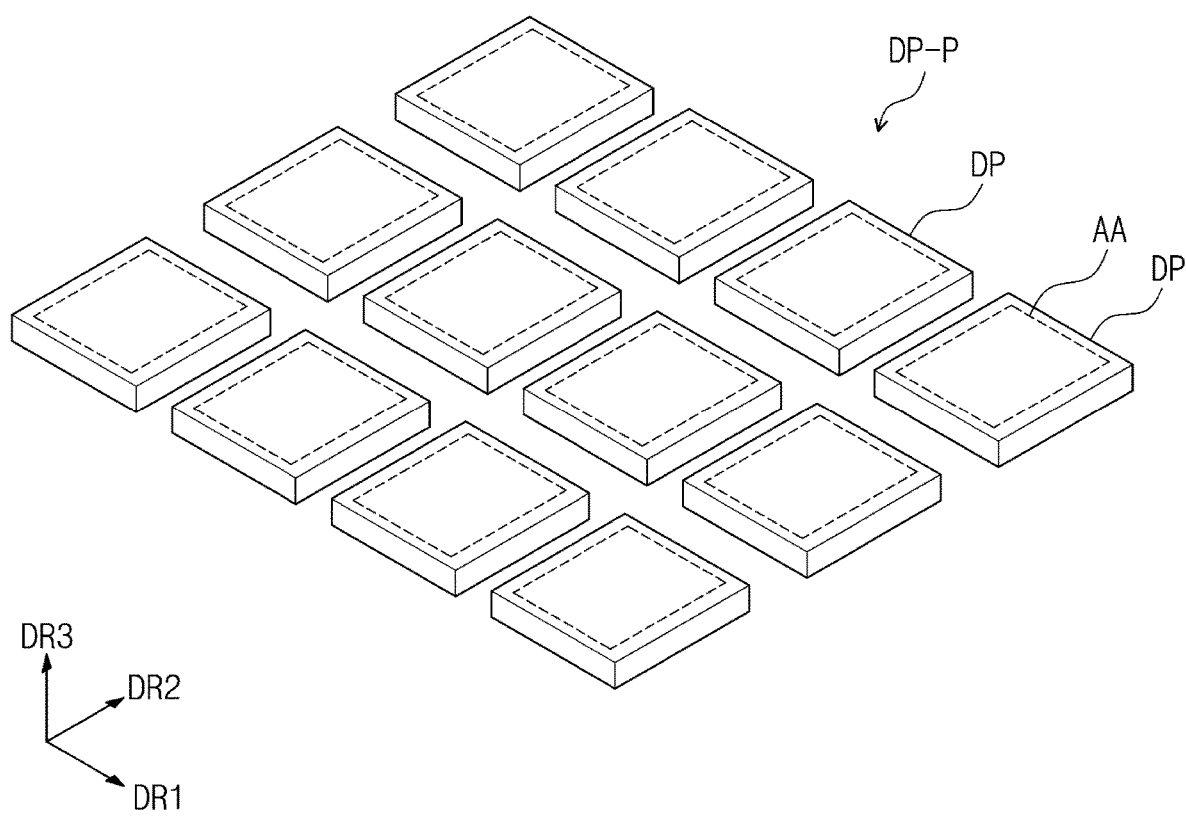
Figure 8C:
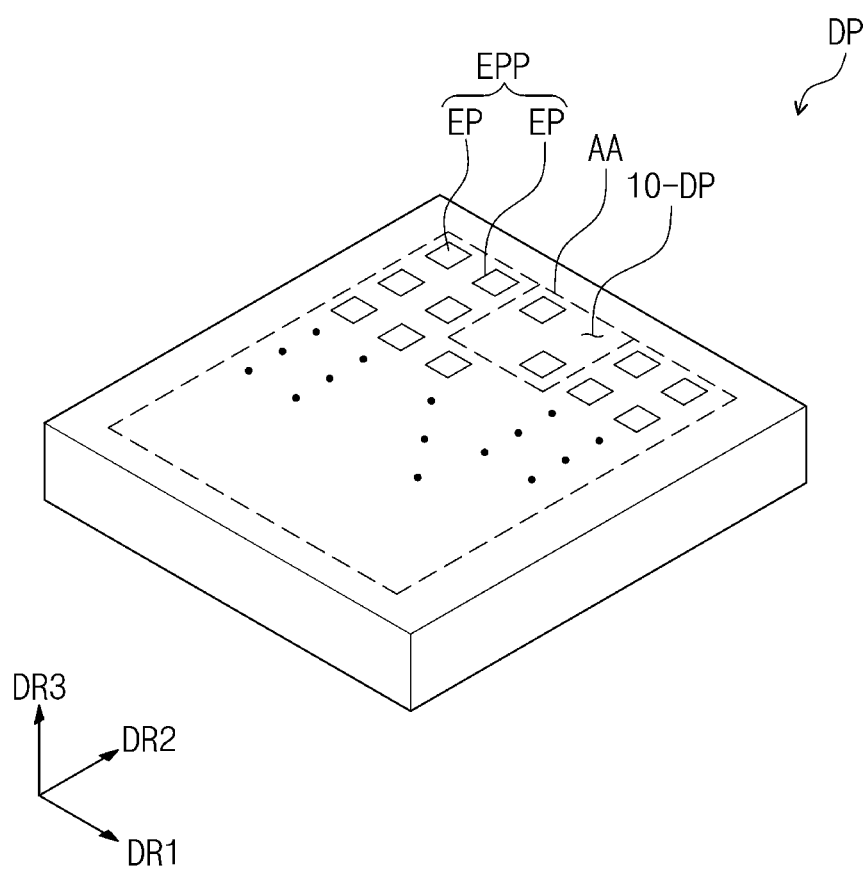

FIGS. 8A to 8C are perspective views illustrating some steps of a method of fabricating a display panel, according to some embodiments of the present disclosure.

Referring to FIGS. 8A to 8C, FIG. 8A illustrates a deposition substrate DP-I2 on which a deposition material EPP is deposited using the metal mask MSK. The deposition material EPP may be formed on a region of the initial substrate DP-I1 corresponding to the cell region CA (e.g., see FIG. 1) of the metal mask MSK. The deposition material EPP may be, for example, an organic material.

A plurality of panels DP-P may be formed by cutting the deposition substrate DP-I2 along cutting lines CL defined in the deposition substrate DP-I2. Each of the panels DP-P may form a display panel DP.

Referring to FIG. 8C, the display panel DP may include at least one active region AA. The active region AA may include a plurality of pixels PX. The active region AA may correspond to a region, on which the deposition material EPP is located, and the deposition material EPP may serve as a plurality of light-emitting patterns EP.

In some embodiments, the light-emitting patterns EP may be formed to correspond to the first and the second openings OP10 and OP20 (e.g., see FIGS. 3B and 4B), respectively, of the metal mask MSK. Because a density of the first opening OP10 (e.g., see FIG. 3B) of the first region 10 of the metal mask MSK is relatively lower than a density of the second opening OP20 (e.g., see FIG. 4B) of the second region 20, a region 10-DP of the display panel DP corresponding to the first region 10 may be formed to have lower density of the light-emitting patterns EP than that of other regions.

According to some embodiments of the present disclosure, the metal mask MSK may include the first and second etching portions HM1 and HM2 that are provided in the first region 10, which has an opening density that is lower than that of the second region 20, thereby making it possible to have a difference in volume between the first and second regions 10 and 20. However, because the difference in volume between the first and second regions 10 and 20 is reduced, it may be possible to reduce, prevent, or otherwise suppress a portion of the metal mask MSK that is located near a border between the first and second regions 10 and 20 from being deformed or wrinkled by a volume difference when a tensile force is exerted on the metal mask MSK.

According to some embodiments of the present disclosure, it may be possible to reduce or suppress deformation of a metal mask when the metal mask is stretched.

While embodiments of the present disclosure have been particularly shown and described, it will be understood by one of ordinary skill in the art that variations in form and detail may be made therein without departing from the spirit and scope of the attached claims, the functional equivalents thereof to be included therein.

What is claimed is:

1. A metal mask comprising a metal thin film having a first thickness and having:

a first region comprising a transmission region defining first openings penetrating the metal thin film, and a non-transmission region comprising a first etching portion having a second thickness that is smaller than the first thickness; and a second region adjacent the first region, and defining second openings penetrating the metal thin film, wherein an opening density of the first region is less than an opening density of the second region, the opening density of the first region being defined as a number of the first openings per an area of the first region, and the opening density of the second region being defined as a number of the second openings per an area of the second region, wherein the non-transmission region further comprises a second etching portion neighboring the first etching portion, and a rib portion between the first etching portion and the second etching portion and spaced apart from the first openings, wherein the rib portion has a third thickness that is smaller than the first thickness.

2. The metal mask of claim 1, wherein each of the transmission region and the non-transmission region is provided in plural in the first region.

3. The metal mask of claim 2, wherein at least two non-transmission regions are adjacent to each other.

4. The metal mask of claim 1, wherein the first etching portion of the non-transmission region is adjacent to the first openings.

5. The metal mask of claim 1, wherein the second thickness is between about 10% to about 50% of the first thickness.

6. The metal mask of claim 1, wherein the first etching portion and the second etching portion have substantially a same thickness.

7. The metal mask of claim 1, wherein a thickness of the rib portion is greater than about 30% of a thickness of the metal thin film, and is smaller than or equal to about 80% of the thickness of the metal thin film.

8. The metal mask of claim 1, wherein the area of the first region is less than the area of the second region.

9. A metal mask comprising a metal thin film having a first thickness and having a first region and a second region each defining an opening penetrating the metal thin film, wherein an opening density of the first region is smaller than an opening density of the second region, wherein the first region comprises a non-transmission region comprising a first etching portion that is adjacent to the opening of the first region, and that has a thickness that is less than a thickness of the metal thin film, wherein the non-transmission region further comprises a second etching portion neighboring the first etching portion, and a rib portion between the first etching portion and the second etching portion and spaced apart from the opening, wherein the rib portion has a third thickness that is smaller than the first thickness.

10. The metal mask of claim 9, wherein the first and second etching portions have substantially a same thickness as each other.

11. The metal mask of claim 10, wherein a thickness of the rib portion is greater than about 30% and is equal to or smaller than about 80% of the thickness of the metal thin film.

12. The metal mask of claim 9, wherein an area of the first region is less than an area of the second region.

13. The metal mask of claim 9, wherein the first region is adjacent to the second region.

14. A metal mask, comprising a metal thin film having a first thickness, and comprising a first region defining first openings, and a second region defining second openings, the first region comprising:

a supporting portion having the first thickness;

a first etching portion and a second etching portion each having a second thickness that is less than the first thickness; and a rib portion between the first etching portion and the second etching portion, spaced apart from the first openings, and having a third thickness, wherein an opening density of the first region is less than an opening density of the second region, the opening density of the first region being defined as a number of the first openings per an area of the first region, and the opening density of the second region being defined as a number of the second openings per an area of the second region, and wherein the rib portion is spaced apart from the first openings, and wherein the third thickness is smaller than the first thickness.

15. The metal mask of claim 14, wherein the third thickness is greater than about 30% of the first thickness and is smaller than or equal to about 80% of the first thickness.

* * * * *